(12) United States Patent
Iioka

(10) Patent No.: US 7,864,576 B2
(45) Date of Patent: Jan. 4, 2011

(54) NONVOLATILE MEMORY CELL ARRAY ARCHITECTURE FOR HIGH SPEED READING

(75) Inventor: Osamu Iioka, Kawasaki (JP)

(73) Assignee: Fujitsu Semiconductor Limited, Yokohama (JP)

(*) Notice: Subject to any disclaimer, the term of this patent is extended or adjusted under 35 U.S.C. 154(b) by 0 days.

(21) Appl. No.: 11/707,130

(22) Filed: Feb. 16, 2007

(65) Prior Publication Data

US 2007/0140039 A1 Jun. 21, 2007

Related U.S. Application Data

(63) Continuation of application No. PCT/JP2004/011751, filed on Aug. 16, 2004.

(51) Int. Cl.
G11C 11/34 (2006.01)
G11C 16/04 (2006.01)

(52) U.S. Cl. .................... 365/185.05; 365/185.26; 365/185.23

(58) Field of Classification Search ............ 365/185.26, 365/185.23, 185.05
See application file for complete search history.

(56) References Cited

U.S. PATENT DOCUMENTS

| | | | |
|---|---|---|---|
| 5,671,177 A | 9/1997 | Ueki | |
| 5,694,358 A | 12/1997 | Kawahara et al. | |
| 5,969,986 A | 10/1999 | Wong et al. | |
| 6,288,938 B1 * | 9/2001 | Park et al. | 365/185.08 |
| 6,449,188 B1 * | 9/2002 | Fastow | 365/185.18 |
| 6,828,622 B2 * | 12/2004 | Kitamura et al. | 257/316 |
| 6,950,367 B2 * | 9/2005 | Kaneko | 365/230.03 |
| 7,190,615 B2 * | 3/2007 | Fujito et al. | 365/185.05 |

FOREIGN PATENT DOCUMENTS

| | | |
|---|---|---|
| JP | 8-36894 A | 2/1996 |
| JP | 8-69696 A | 3/1996 |
| JP | 7-114796 A | 5/1996 |
| JP | 08-204159 | 8/1996 |
| JP | 9-73797 A | 3/1997 |
| JP | 2000-68482 A | 3/2000 |
| JP | 2000-82295 A | 3/2000 |
| JP | 2004-172355 | 6/2004 |

* cited by examiner

*Primary Examiner*—Hoai V Ho
*Assistant Examiner*—Kretelia Graham
(74) *Attorney, Agent, or Firm*—Arent Fox LLP

(57) ABSTRACT

When different word lines are accessed sequentially, to perform access operations in parallel, a word decoder overlaps a part of activation periods of those word lines. That is, a nonvolatile semiconductor memory is capable of pipeline processing for performing access operations in parallel. All the combinations of bit lines and source lines that are connected to the drains and the sources of nonvolatile memory cells are different from each other. Therefore, even when plural word lines are activated to perform plural read operations in parallel, a memory cell current is allowed to flow only between the drain and the source of a nonvolatile memory cell concerned. As a result, random access in which desired nonvolatile memory cells are accessed sequentially is enabled in a nonvolatile semiconductor memory having a pipeline function for performing plural read operations in parallel.

8 Claims, 7 Drawing Sheets

| memory cell in reading | next memory cell to be read | | |
|---|---|---|---|
| | state A | state B | state C |
| 5V—G⊩D—1V / S—0V | 5V—G⊩D—open or 0V / S—0V | 5V—G⊩D—1V / S—open or 1V | 5V—G⊩D—open / S—open |

Fig. 5

NONVOLATILE MEMORY CELL ARRAY ARCHITECTURE FOR HIGH SPEED READING

CROSS REFERENCE TO RELATED APPLICATION

This application is continuation application of International Application PCT/JP2004/011751, filed Aug. 16, 2004, and designating the U.S.

BACKGROUND OF THE INVENTION

1. Field of the Invention

The present invention relates to a nonvolatile semiconductor memory having nonvolatile memory cells.

2. Description of the Related Art

Nonvolatile semiconductor memories such as flash memories store data by holding or not holding electrons in the floating gates or trap gates of memory cell transistors (hereinafter also referred to as "memory cells"). For example, in a nonvolatile semiconductor memory disclosed in Japanese Unexamined Patent Application Publication No. 7-114796, memory cells are formed at the intersecting points of word lines and bit lines which are perpendicular to each other. Source lines which are connected to the sources of the memory cells are arranged parallel with the word lines. The sources of memory cells that are arranged along a pair of word lines are connected to a common source line. The drains of memory cells that are arranged parallel with the bit lines are connected to a common bit line.

Japanese Unexamined Patent Application Publication No. 8-69696 discloses a technique which makes it possible to continuously read data from memory cells even at the time of word line switching by accessing two memory cell arrays (subarrays) alternately.

In the nonvolatile semiconductor memory of Japanese Unexamined Patent Application Publication No. 7-114796, memory cells that are connected to adjoining word lines and arranged parallel with the bit lines are connected to a common bit line and a common source line. In performing reading on these memory cells, selection periods of the adjoining word lines are not allowed to overlap with each other. Therefore, where addresses are supplied randomly (random access) in read operations, data cannot be output continuously from the memory cells. In the technique of Japanese Unexamined Patent Application Publication No. 8-69696, random access is possible only when the subarrays are accessed alternately. That is, where random access is performed on one subarray, data cannot be output continuously. In particular, random access cannot be performed in nonvolatile semiconductor memories in which parallel processing (pipeline processing) is performed by overlapping a part of activation periods of word lines in read operations.

SUMMARY OF THE INVENTION

An object of the present invention is therefore to enable random access in a nonvolatile semiconductor memory having a pipeline function for performing consecutive read operations in parallel. In particular, it is an object of the invention to provide a nonvolatile semiconductor memory which enables random access without increasing the chip size.

One form of the invention is as follows. Word lines, bit lines, and source lines are connected to the gates, drains, and sources, respectively, of nonvolatile memory cells which are arranged in matrix form. A word decoder activates a word line according to an address signal. When different word lines are accessed, the word decoder overlaps activation periods of the word lines to perform access operations in parallel. That is, the nonvolatile semiconductor memory is capable of pipeline processing for performing access operations in parallel. All the combinations of bit lines and source lines that are connected to the drains and the sources of nonvolatile memory cells are different from each other. Therefore, even when plural word lines are activated to perform plural read operations in parallel, a memory cell current is allowed to flow only between the drain and the source of a nonvolatile memory cell concerned. As a result, random access in which desired nonvolatile memory cells are accessed sequentially is enabled in a nonvolatile semiconductor memory having a pipeline function for performing plural read operations in parallel.

In a preferred example of the one form of the invention, plural cell groups each of which is a series connection of nonvolatile memory cells are arranged in a wiring direction of the word lines. In each cell group pair which is a pair of adjoining cell groups, a pair of bit lines are arranged so as to cross each other in zigzag form. The change in the wiring method of the bit lines makes it possible to construct a nonvolatile semiconductor memory capable of random access without increasing the chip size.

In another preferred example of the one form of the invention, each of the cell groups is formed by plural nonvolatile memory cell pairs each of which is a pair of nonvolatile memory cells whose sources are connected to each other. In each of the cell group pairs, confronting nonvolatile memory cell pairs are connected to different source lines. Therefore, the combination of bit lines and source lines that are connected to the drains and the sources of nonvolatile semiconductor memory can be made entirely unique to each combination of two confronting nonvolatile memory cell pairs (including four nonvolatile memory cells).

In another preferred example of the one form of the invention, a source region in which sources are formed and a drain region in which drains are formed are formed alternately between the word lines. In each of the cell group pairs, a pair of source lines connected to the sources of confronting nonvolatile memory cell pairs are formed in a source region and a drain region, respectively. This makes it possible to arrange more source lines than in conventional cases without increasing the size of the memory cell array, that is, to prevent increase of the chip size of the nonvolatile semiconductor memory.

In still another preferred example of the one form of the invention, the source line in the drain region has projecting parts which project toward the source region. The source line in the drain region is formed by using a wiring layer which is located under a wiring layer of the source line in the source region. Even in the case of arranging more source lines than in conventional cases, this makes it possible to increase the wiring width of each source line and thereby reduce the source resistance without increasing the chip size.

In another preferred example of the one form of the invention, each of the cell groups is formed by plural nonvolatile memory cell pairs each of which is a pair of nonvolatile memory cells whose sources are connected to each other. In adjoining cell group pairs, the sources of confronting nonvolatile memory cell pairs are formed by a common diffusion layer. This makes it possible to reduce the total area of the source diffusion layers and hence to reduce the chip size of the nonvolatile semiconductor memory.

In another preferred example of the one form of the invention, contact parts which are formed between the cell group pairs connect, to the diffusion layers, the source lines formed by using wiring layers. The source lines are connected to the diffusion layers via the contact parts. This makes it possible to minimize the number of contact parts and hence to prevent increase of the chip size.

In another preferred example of the one form of the invention, in each of the cell group pairs, confronting nonvolatile memory cell group pairs are connected to different source lines. Contact parts arranged in the wiring direction of the word lines are connected to two source lines alternately. This example can also minimize the number of contact parts and hence to prevent increase of the chip size.

In yet another preferred example of the one form of the invention, in accessing a memory cell, a source decoder sets the voltage of a source line connected to the nonvolatile memory cell to be accessed at a ground voltage and sets the other source lines in a floating state. Therefore, even when plural word lines are activated by pipeline processing, a memory cell current is allowed to flow only between the drain and the source of a nonvolatile memory cell concerned. As a result, random access in which desired nonvolatile memory cells are accessed sequentially is enabled in a nonvolatile semiconductor memory which performs plural read operations in parallel.

In a further preferred example of the one form of the invention, in accessing a memory cell, a column decoder sets the voltage of a bit line connected to the nonvolatile memory cell to be accessed at a drain voltage and sets the other bit lines in a floating state. Also in this example, even when plural word lines are activated by pipeline processing, a memory cell current is allowed to flow only between the drain and the source of a nonvolatile memory cell concerned. As a result, random access in which desired nonvolatile memory cells are accessed sequentially is enabled in a nonvolatile semiconductor memory which performs plural read operations in parallel.

BRIEF DESCRIPTION OF THE DRAWINGS

The nature, principle, and utility of the invention will become more apparent from the following detailed description when read in conjunction with the accompanying drawings in which like parts are designated by identical reference numbers, in which:

FIG. 5 is an explanatory diagram showing the states of memory cells when read operations are performed consecutively;

DESCRIPTION OF THE PREFERRED EMBODIMENTS

Figure 1:
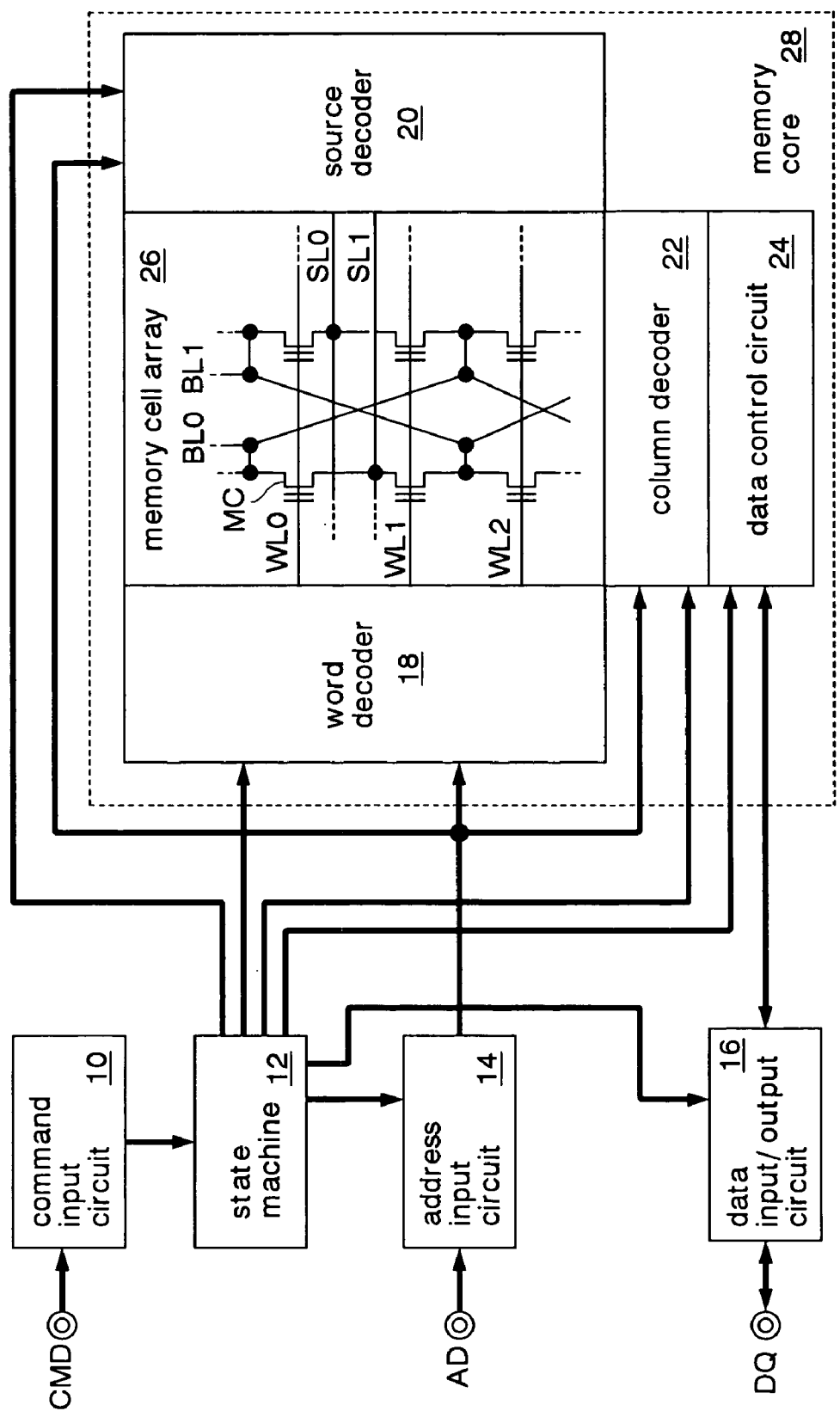
FIG. 1 is a block diagram showing a nonvolatile semiconductor memory according to an embodiment of the present invention.

An embodiment of the present invention will be hereinafter described with reference to the drawings. Double circles in the drawings mean external terminals. In the drawings, a signal line shown by a thick line is composed of plural lines. In the drawings, each of part of blocks to which the thick line(s) is connected is composed of plural circuits. A signal that is supplied via an external terminal is denoted by a symbol that is the same as the name of the terminal. A signal line that transmits a signal is given a symbol that is the same as the name of the signal.

FIG. 1 shows a nonvolatile semiconductor memory according to an embodiment of the invention. This nonvolatile semiconductor memory is a NOR flash memory which is formed on a silicon substrate by a CMOS process. The flash memory has a command input circuit 10, a state machine 12, an address input circuit 14, a data input/output circuit 16, a word decoder 18, a source decoder 20, a column decoder 22, a data control circuit 24, and a memory cell 20 array 26. The word decoder 18, source decoder 20, column decoder 22, data control circuit 24, and memory cell array 26 constitute a memory core 28.

The command input circuit 10 decodes a command signal CMD received via a command terminal CMD, and communicates the decoded command to the state machine 12. Examples of command signals CMD are a chip enable signal, an output enable signal, and a write enable signal. The state machine 12 generates, according to the command decoded by the command input circuit 10, plural timing signals for operation of the flash memory, and outputs the generated timing signals to the internal circuits (address input circuit 14, data input/output circuit 16, word decoder 18, source decoder 20, column decoder 22, data control circuit 24, etc.). To enable pipeline processing for performing plural read operations (access operations) in parallel, the state machine 12 divides a process of the internal circuits into plural independent steps. The individual steps are executed sequentially according to the timing signals. The pipeline processing will be described later with reference to FIG. 4.

The address input circuit 14 outputs, to the word decoder 18, the source decoder 20, and the column decoder 22, an address signal AD which is received via an address terminal AD. A predecoder for predecoding an address signal AD may be disposed between the address input circuit 14 and the set of the word decoder 18, the source decoder 20, and the column decoder 22. The data input/output circuit 16 outputs, to a data terminal DQ, data that are read from the memory cell array 26. The data input/output circuit 16 receives, via the data terminal DQ, data to be written to the memory cell array 26. Another configuration is possible in which part of a command signal is received by the data terminal DQ and the state machine 12 determines an operation command by combining it with a command signal CMD received by the command terminal CMD.

In accessing a memory cell MC, the word decoder 18 selects one of the word lines WL according to an address signal AD. The word decoder 18 has a function of overlapping activation periods of word lines WL under the control of the state machine 12 when read operations are performed consecutively and different word lines WL are selected sequentially. In a read operation, the source decoder 20 sets the voltage of a source line SL that is selected according an address signal AD at a ground voltage and sets the other source lines SL in a floating state. That is, the voltage of the source line SL that is connected to a nonvolatile memory cell MC to be accessed is set at the ground voltage and the other source lines SL are set in a floating state. In a read operation, the column decoder 22 sets the voltage of a bit line BL to be selected according to an address signal AD at a drain voltage (e.g., 1 V) and sets the other bit lines BL in a floating state. That is, the bit line BL that is connected to the nonvolatile memory cell MC to be accessed is set at the drain voltage and the other bit lines BL are set in a floating state.

The data control circuit 24 has sense amplifiers, a data write circuit, etc. (not shown). Each sense amplifier detects a memory cell current flowing between the drain and the source of a memory cell MC in a read operation, and judges the logical value of data held by the memory cell MC. The write circuit controls a data write operation (programming) and an erase operation.

The memory cell array 26 has plural nonvolatile memory cells MC which are arranged in matrix form. Each memory cell MC is formed by a memory cell transistor having a floating gate. The control gate of each memory cell MC is connected to one of the word lines WL (WL0, 1, ... ). The drain of each memory cell MC is connected to one of the bit lines BL (BL0, 1, ... ). The source of each memory cell MC is connected to one of the source lines SL (SL0, 1, ... ). The details of the memory cell array 26 will be described below with reference to FIGS. 2 and 3.

Figure 2:
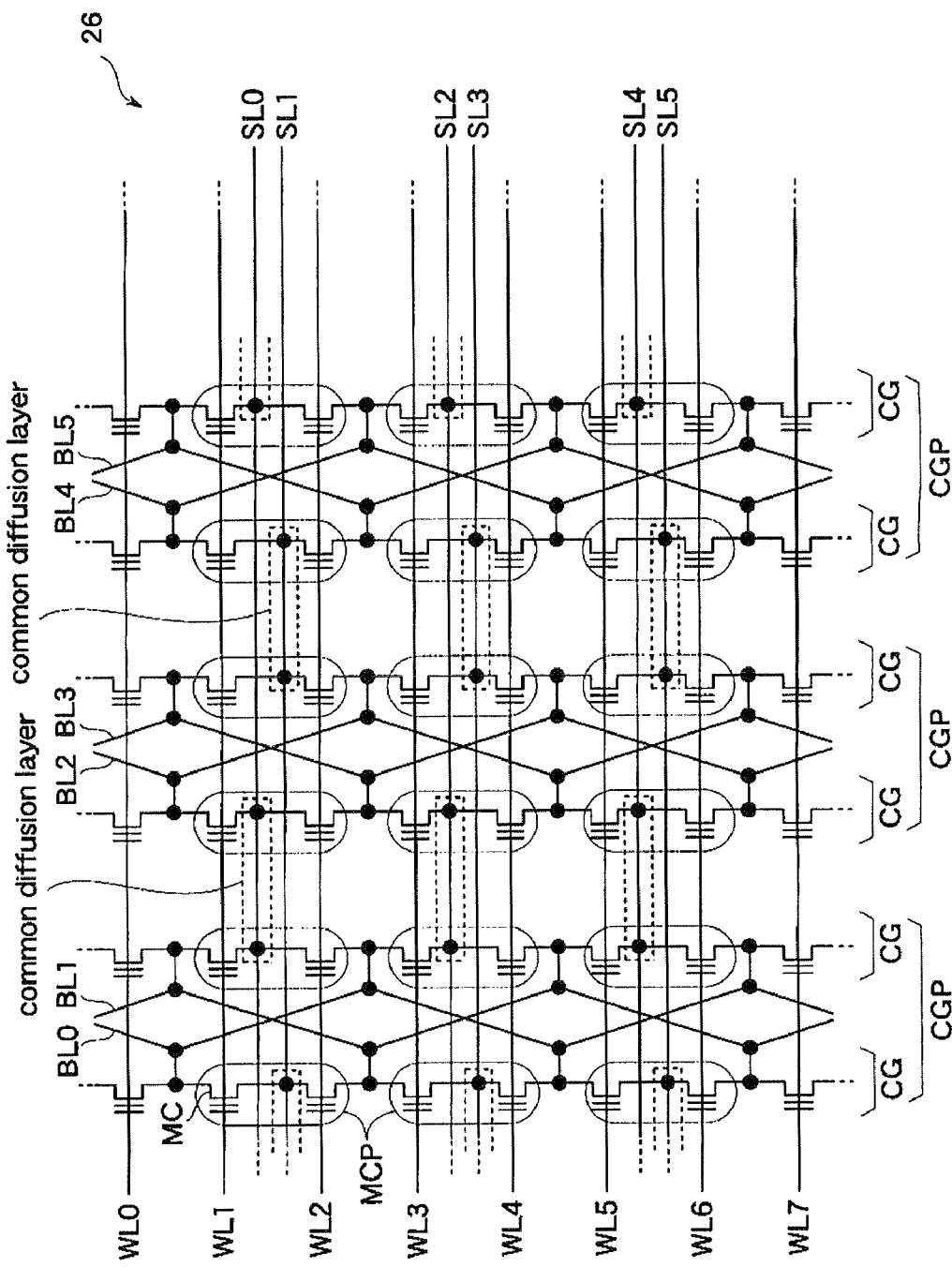
FIG. 2 is a circuit diagram showing the details of a memory cell array shown in FIG. 1.

FIG. 2 shows the details of the circuit of the memory cell array 26 shown in FIG. 1. The memory cell array 26 has plural cell groups CG each of which is a series connection of memory cells MC. Each cell group CG consists of nonvolatile memory cell pairs MCP (enclosed of elliptical frames in FIG. 2) each of which is a pair of memory cells MC whose sources are connected to each other. The cell groups CG are arranged in the wiring direction of the word lines WL (right-left direction in FIG. 2). Each cell group pair CGP is formed by a pair of adjoining cell groups. A pair of bit lines BL (e.g., BL0 and BL1) are provided for each cell group pair CGP so as to extend in the direction perpendicular to the word lines WL. Each pair of bit lines BL are arranged so as to cross each other in zigzag form.

In adjoining cell group pairs CGP, the sources of confronting memory cell pairs MCP are formed in a common diffusion layer (indicated by a broken-line rectangular frame). In each cell group pair CGP, two confronting nonvolatile memory cell pairs MCP are connected to different source lines SL For example, two memory cell pairs MCP that are connected to the word line WL1, 2 are connected to the different source lines SL1 and SL0. In the following description, two confronting memory cell pairs MCP (including four memory cells MC) in each cell group pair CGP will also be referred to as "memory cell group." The combination of bit lines BL and source lines SL connected to the drains and the sources of memory cells MC is entirely unique to each memory cell group.

The plural memory cell groups are different from each other in at least one of the word line pair WL and the bit line pair BL. Therefore, all the combinations of bit lines BL and source lines SL connected to the drains and the sources of memory cells MC can be made different from each other without increasing the layout size of the memory cell array 26 by arranging the bit line pairs BL in zigzag form and connecting different source lines SL to two confronting memory cell pairs MCP in each cell group pair CGP.

Figure 3:
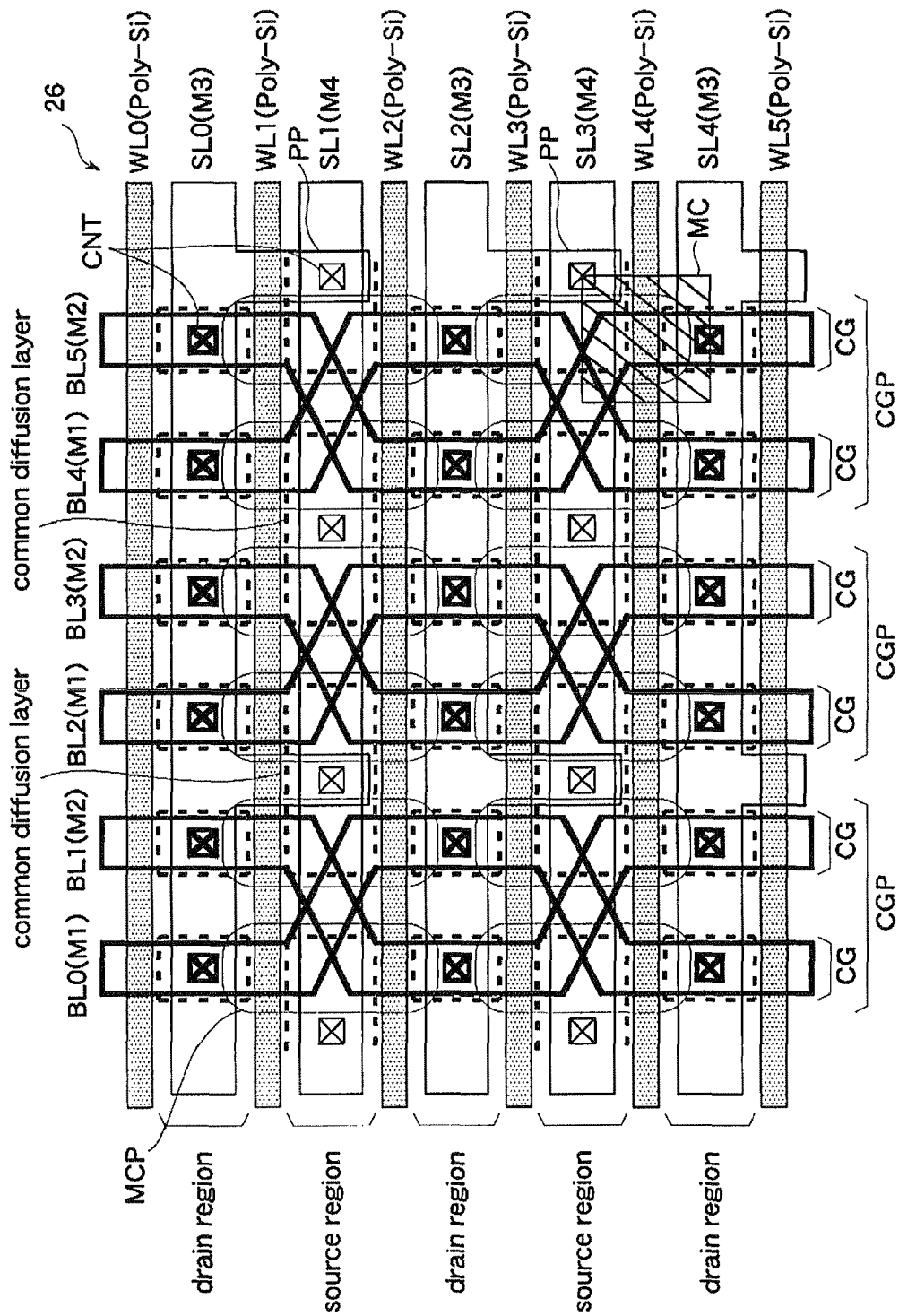
FIG. 3 is a layout diagram showing the details of the memory cell array shown in FIG. 1.

FIG. 3 shows the details of the layout of the memory cell array 26 shown in FIG. 1. In FIG. 3, thick-broken-line frames indicate diffusion layers formed on a semiconductor substrate. The word lines WL (shaded) are made of polysilicon (poly-Si). The bit lines BL (indicated by thick solid lines) are formed by first metal wiring layers M1 and second metal wiring layers M2. The source lines SL (indicated by thin solid lines) are formed by third metal wiring layers M3 and fourth metal wiring layers M4. The metal wiring layers M1, M2, M3, and M4 are formed on the semiconductor substrate in this order. Square frames marked with "X" indicate contacts CNT (plugs; contact parts) for connecting the diffusion layers to the metal wiring layers M1-M4. Contacts CNT for the bit lines BL are indicated by thick-line square frames and contacts CNT for the source lines SL are indicated by thin-line square frames. A hatched region in FIG. 3 indicates one memory cell MC. In FIG. 3, to clearly discriminate the interconnections, part of the interconnections are drawn so as to be thinner than actual ones. In practice, the interconnections have widths that satisfy a layout design standard.

Each pair of bit lines crosses each other in source regions. A source region where the sources of memory cells MC are formed and a drain region where the drains of memory cells MC are formed are formed alternately between the word lines WL. The thick-broken-line frames in the source regions indicate source diffusion layers, and the thick-broken-line frames in the drain regions indicate drain diffusion layers. The even-numbered source lines SL0, SL2, ... are formed in the drain regions, and the odd-numbered source lines SL1, SL3, ... are formed in the source regions. In each cell group pair CGP, a pair of source lines SL that are connected to the sources of confronting memory cell pairs MCP are formed on a source region and a drain region, respectively. That is, in each cell group pair CGP, confronting memory cell pairs MCP are connected to different source lines SL. Forming the source lines SL in the source regions and the drain regions makes it possible to arrange more source lines than in conventional cases without increasing the size of the memory cell array. Furthermore, forming the source lines SL using the two sets of metal wiring layers M3 and M4 makes it possible to increase the width of each source line SL and hence to reduce the source resistance without increasing the chip size.

The source lines SL in the source regions are connected directly to the diffusion layers via the contacts CNT. Each source line SL in a drain region has projecting parts PP which project toward a source region, that is, to above a source diffusion layer. The source lines SL in the drain regions are connected to the diffusion layers via the projecting parts PP and the contacts CNT. These contacts CNT are formed between the cell group pairs CGP. Contacts CNT that are arranged in the wiring direction of the word lines WL (horizontal direction in FIG. 3) are alternately connected to the source line SL in a source region and the source line SL in a drain region. As described above, in adjoining cell group pairs CGP, the sources of confronting memory cell pairs MCP are formed by a common diffusion layer. This makes it possible to minimize the number of contacts CNT formed and hence to reduce the total area of the source diffusion layers, which in turn makes it possible to reduce the chip size of the flash memory. Furthermore, forming the contacts CNT for the source lines between the cell group pairs CGP can prevent those contacts CNT from being short-circuited with the bit lines BL.

Figure 4:
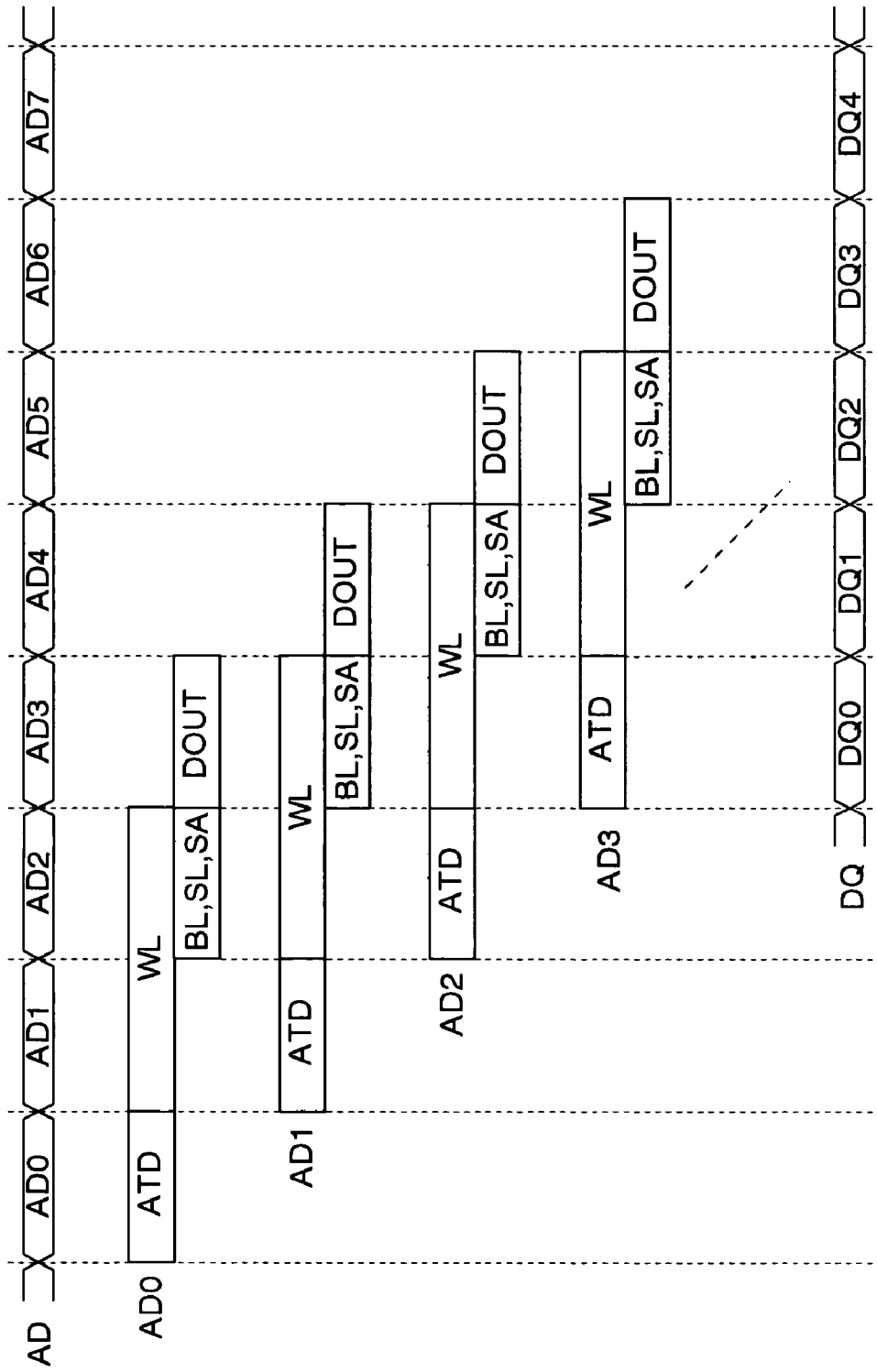
FIG. 4 is a timing diagram showing exemplary read operations of the flash memory according to the invention.

FIG. 4 shows exemplary read operation of the flash memory according to the invention. In this example, the flash memory consecutively receives address signals AD (AD0, AD1, ... ) together with read commands and performs read operations consecutively. As the read operations are performed, read-out data DQ (DQ0, DQ1, ... ) are output consecutively. The latency from supply of an address signal AD to output of a data signal DQ is "4." However, the invention can also be applied to read operation whose latency is not equal to "4."

One read operation consists of four steps, which are an address signal AD detection step (ATD), a word line WL activation step (WL), a data read step (BL, SL, SA), and data output step (DOUT). Symbol ATD denotes an address signal AD selection and validation period (detection of a transition of an address signal AD). Symbol WL denotes a word line WL selection period (boost period). Symbol BL denotes a bit line BL selection period. Symbol SL denotes a source line SL selection period. Symbol SA denotes a period of data judgment by a sense amplifier. Symbol DOUT denotes a data output period.

These steps are executed independently of each other under the control of the state machine 12. Forming one read operation by plural steps that are independent of each other enables pipeline processing which performs plural read operations in parallel. The pipeline processing makes it possible to shorten the external read cycle which is the data signal DQ output cycle and hence to increase the data transfer rate.

The activation of a word line WL needs to be continued until readout of data. Therefore, the period of a word line WL activation step includes the period of a data read step (BL, SL, SA). In other words, another word line WL is activated for the next read operation while a word line WL is activated and a data read step is being executed in a current read operation. Therefore, when read operations occur consecutively, word line WL activation steps overlap with each other. Conventional nonvolatile semiconductor memories having a pipeline function cannot perform the pipeline operation of FIG. 4 in the case of random access for performing read operations in response to consecutively received, arbitrary address signals AD. In contrast, in the invention, a pipeline operation can be performed even in the case of random access because all the combinations of bit lines BL and source lines SL that are connected to the drains and the sources of memory cells MC are different from each other.

FIG. 5 shows the states of memory cells MC when read operations are performed consecutively. In a memory cell MC from which to read data receives, the gate G receives a boost voltage (e.g., 5 V), the drain D receives a drain voltage (e.g., 1 V), and the source S receives a ground voltage (0 V). The logical value being held by the memory cell MC is judged in accordance with a memory cell current flowing between the drain and the source. The gate voltage is set by the word decoder 18 under the control of the state machine 12. The drain voltage is set by the column decoder 22 under the control of the state machine 12. The source voltage is set by the source decoder 20 under the control of the state machine 12.

In the flash memory, to perform pipeline reading, the voltage of the word line WL that is connected to a memory cell MC for the next reading is set at the boost voltage in a period when reading is being performed on a certain memory cell MC, that is, the voltage of a certain word line WL is set at the boost voltage. At this time, the data of the memory cell MC under reading could not be judged correctly if a memory cell current flew from the memory cell MC for the next reading to the bit line BL or the source line SL that is connected to the memory cell MC under reading. To prevent such erroneous reading of data, it is necessary that the memory cell MC for the next reading (i.e., the memory cell MC the voltage of the word line WL connected to which is set at the boost voltage) be set in one of states A, B, and C so that no memory cell current flows from it. That is, it is necessary that, in the memory cell MC for the next reading, one of the drain D and the source S be set in a floating state (open) or the drain D-source S voltage be set at 0 V. More specifically, in the case of state A, the drain D is rendered open or its voltage is set at 0 V (source voltage). In the case of state B, the source S is rendered open or its voltage is set at 1 V (drain voltage).

Figure 6:
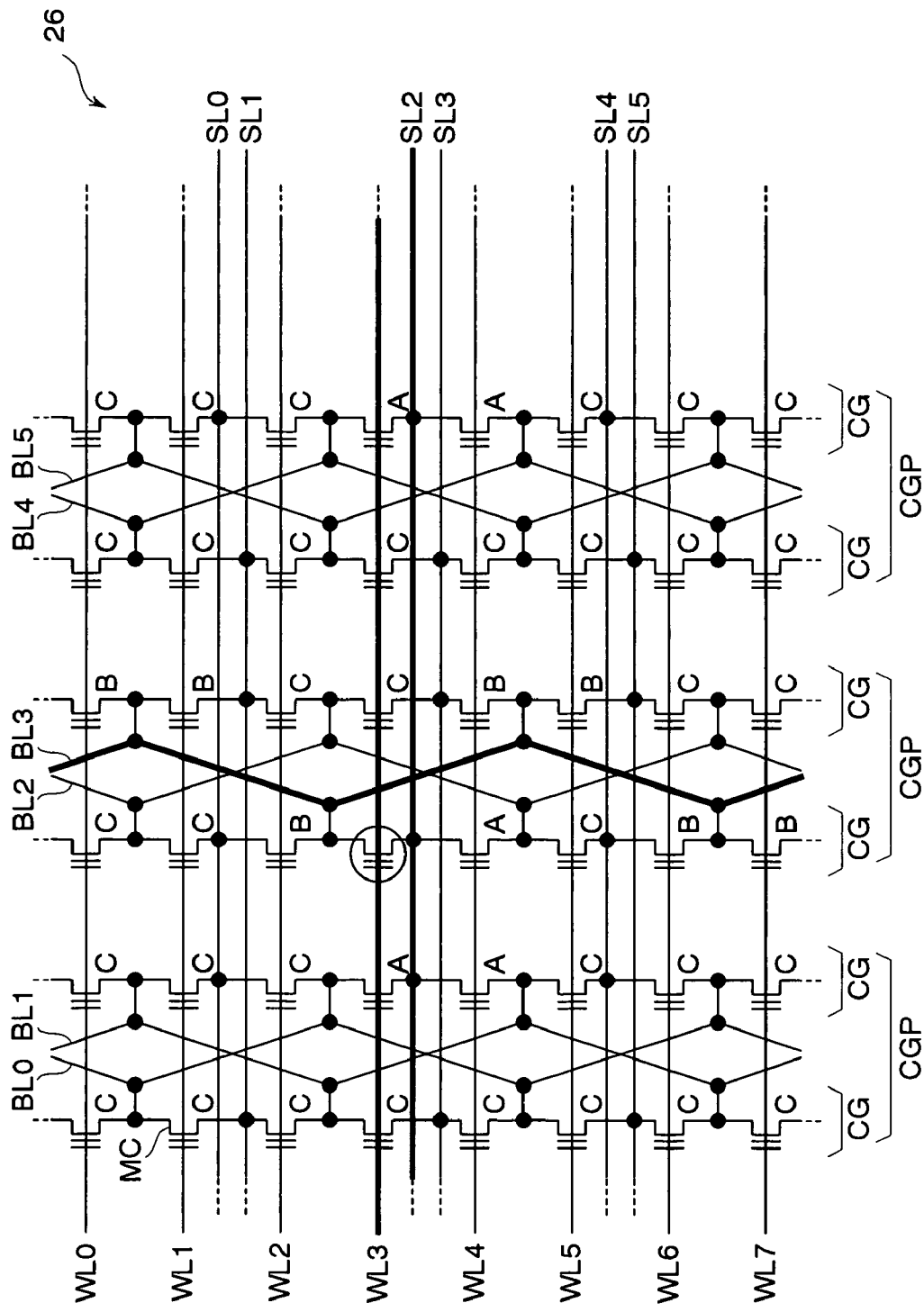
FIG. 6 is a circuit diagram showing the states of memory cells when read operations are performed consecutively.

FIG. 6 shows the states of memory cells MC when read operations are performed consecutively. In this example, a reading operation is being performed on the memory cell MC 10 circled. Therefore, the word line WL3, the bit line BL3, and the source line SL2 which are indicated by thick lines are set at the boost voltage, the drain voltage, and the ground voltage, respectively. Symbols A, B, and C that are written adjacent to the respective memory cells MC means states A, B, and C (see FIG. 5) to be established when the boost voltage is supplied to the word line WL3.

When the word line WL that is connected to the memory cell MC for the next reading is activated, all memory cells MC are set in one of states A, B, and C. More specifically, if the memory cell MC for the next reading is another memory cell MC that is connected to the source line SL2, this memory cell MC is set in state A. If the memory cell MC for the next reading is another memory cell MC that is connected to the bit line BL3, this memory cell MC is set in state B. If the memory cell MC for the next reading is a memory cell MC that is categorized otherwise, this memory cell MC is set in state C. As a result, random access (read operations) can be performed in the flash memory having the pipeline function.

Figure 7:
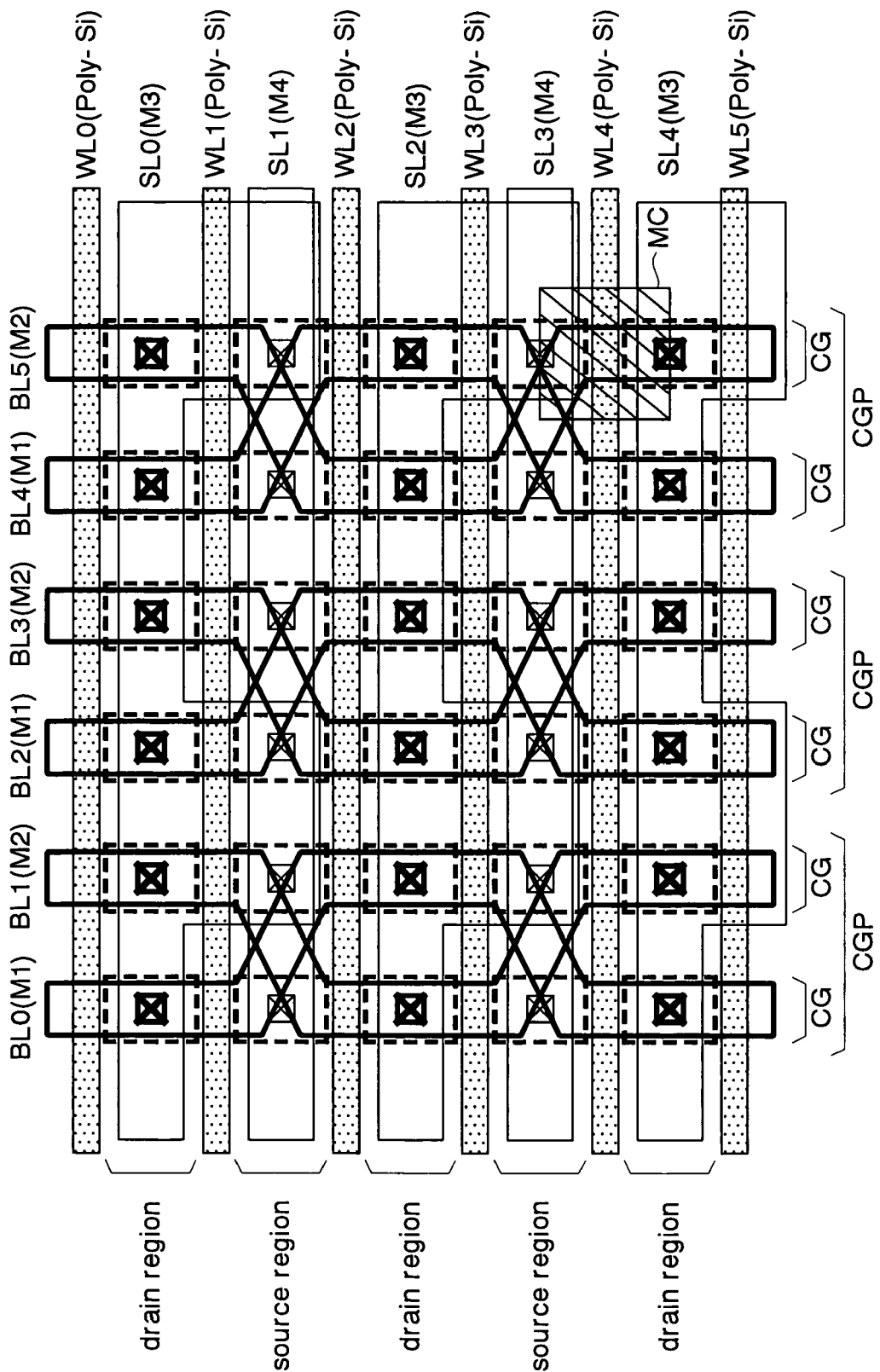
FIG. 7 is a layout diagram of a memory cell array that was studied by the present inventor before the conception of this invention.

FIG. 7 shows an exemplary layout of a memory cell array that was studied by the present inventor before the conception of this invention. This example is different from a conventional memory cell array in that each pair of bit lines BL are zigzagged by using metal wiring layers M1 and M2 and the source lines SL are formed by using metal wiring layers M3 and M4. Contacts CNT for connecting the source lines SL to the source diffusion layers of the memory cells MC are formed for the respective memory cells MC. Where a pair of bit lines BL is zigzagged, it is necessary to cross the bit lines BL in the source regions. Therefore, the bit lines BL would be short-circuited with the contacts CNT in the source regions if no proper measure were taken. If a certain distance were set between the bit lines BL and the contacts CNT to prevent such short-circuiting, the size of the memory cell array would increase. In contrast, the structure that each contact CNT in a source region is disposed between and shared by the cell group pairs CGP adjacent to it can prevent short-circuiting between the bit lines BL and the contacts CNT in the source regions without increasing the size of the memory cell array.

As described above, employing the new technique in the wiring layout of the memory cell array 26, the embodiment realizes the feature that the all the combinations of bit lines BL and source lines SL that are connected to the drains and the sources of memory cells MC can be made different from each other. Under the control of the state machine 12, the source decoder 20 sets, at the ground voltage, the voltage of the source line SL that is connected to a memory cell MC to be accessed and sets the other source lines SL in a floating state. Under the control of the state machine 12, the column decoder 22 sets, at the drain voltage, the voltage of the bit line BL that is connected to a memory cell MC to be accessed and sets the other bit lines BL in a floating state. As a result, random access (random reading) can be performed in the flash memory having the pipeline function for performing plural reading operations in parallel.

In each cell group pair CGP, a pair of bit lines BL are arranged so as to cross each other in zigzag form. Each contact CNT for a source line SL is formed between the cell group pairs CGP adjacent to it so as to be shared by plural memory cells MC. Sharing the contacts CNT makes it possible to construct a flash memory which has a pipeline function and enables random access without increasing the size of the memory cell array 26. Forming the source lines SL in the drain regions and the source regions using the metal wiring layers M3 and M4 makes it possible to arrange more source lines than in conventional cases without increasing the size of the memory cell array.

In the above embodiment, each pair of bit lines BL are arranged so as to cross each other in zigzag form. However, the invention is not limited to such a case. For example, the same advantages can be obtained by arranging each pair of bit lines without crossing them and arranging each pair of source lines in such a manner that they cross each other in zigzag form.

In the above embodiment, each memory cell MC is formed by a memory cell transistor having a floating gate. However, the invention is not limited to such a case. For example, the same advantages can be obtained by forming each memory cell MC by a memory cell transistor having a trap gate.

The invention is not limited to the above embodiments and various modifications may be made without departing from the spirit and scope of the invention. Any improvement may be made in part or all of the components.

What is claimed is:

1. A nonvolatile semiconductor memory comprising:
    plural nonvolatile memory cells arranged in matrix form;
    plural word lines connected to gates of said nonvolatile memory cells;
    plural bit lines connected to drains of said nonvolatile memory cells;
    plural source lines connected to sources of said nonvolatile memory cells;
    a word decoder which activates a word line according to an address signal, and which, when different word lines are accessed sequentially, overlaps a part of activation periods of said different word lines to perform access operations in parallel;
    plural cell groups each of which is a series connection of nonvolatile memory cells and which are arranged in a wiring direction of said plural word lines; and
    cell group pairs, each of which is a pair of adjoining cell groups arranged in said wiring direction of said plural word lines, a pair of bit lines of each of the cell group pairs being arranged so as to cross each other in zigzag form, wherein
    in each of said cell group pairs, confronting nonvolatile memory cell pairs are connected to different source lines and the sources of said nonvolatile memory cells in each of said cell group pairs are connected to each other, and
    all combinations of the bit lines and the source lines connected to the drains and the sources of said nonvolatile memory cells connected to two of said different word lines being optionally selected are different from one another.

2. The nonvolatile semiconductor memory according to claim 1, wherein:
    a source region in which sources are formed and a drain region in which drains are formed are formed alternately between said plural word lines, and
    in each of said cell group pairs, a pair of source lines connected to sources of confronting nonvolatile memory cell pairs are formed in the source region and the drain region, respectively.

3. The nonvolatile semiconductor memory according to claim 2, wherein:
    said source line in said drain region has projecting parts which project toward said source region, and
    said source line in said drain region is formed by using a wiring layer which is located under a wiring layer of said source line in said source region.

4. The nonvolatile semiconductor memory according to claim 1, wherein:
    in adjoining cell group pairs, the sources of confronting nonvolatile memory cell pairs are formed by common diffusion layers.

5. The nonvolatile semiconductor memory according to claim 4, further comprising contact parts which are formed between said adjoining cell group pairs and connect, to said diffusion layers, said source lines formed by using a wiring layer, wherein
    said source lines are connected to said diffusion layers via said contact parts.

6. The nonvolatile semiconductor memory according to claim 5, wherein
    said contact parts arranged in said wiring direction of said plural word lines are connected to two source lines alternately.

7. The nonvolatile semiconductor memory according to claim 1, further comprising a source decoder which, in accessing one of the nonvolatile memory cells, sets a voltage of a source line connected to one of the nonvolatile memory cells to be accessed at a ground voltage and sets the other source lines in a floating state.

8. The nonvolatile semiconductor memory according to claim 1, further comprising a column decoder which, in accessing one of the nonvolatile memory cells, sets a voltage of a bit line connected to one of the nonvolatile memory cells to be accessed at a drain voltage and sets the other bit lines in a floating state.

* * * * *